(12) United States Patent
Biebuyck et al.

(10) Patent No.: US 6,569,575 B1
(45) Date of Patent: May 27, 2003

(54) OPTICAL LITHOGRAPHY BEYOND CONVENTIONAL RESOLUTION LIMITS

(75) Inventors: Hans Biebuyck, Rockville, MD (US); Bruno Michel, Adliswil (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/508,890
(22) PCT Filed: Sep. 19, 1997
(86) PCT No.: PCT/IB97/01124
§ 371 (c)(1), (2), (4) Date: Jun. 19, 2000
(87) PCT Pub. No.: WO99/15933
PCT Pub. Date: Apr. 1, 1999

(51) Int. Cl.⁷ ............... G03F 1/14; G03F 7/20
(52) U.S. Cl. ............ 430/5; 430/296; 430/323
(58) Field of Search .................. 430/5, 323, 321, 430/296

(56) References Cited

U.S. PATENT DOCUMENTS 5,340,637 A * 8/1994 Okai et al. ............ 428/167

FOREIGN PATENT DOCUMENTS

JP 4-190353 A * 7/1992

* cited by examiner

Primary Examiner—John A. McPherson
(74) Attorney, Agent, or Firm—Daniel P. Morris

(57) ABSTRACT

Optical lithography scheme making use of light coupling structures, and elastomeric light coupling structures in particular. These light coupling structures comprise protruding portions and connecting portions. The protruding elements are designed to be brought into conformal contact with a resist to be exposed such that the light guided into the protruding elements is coupled from there directly into the resist. The lateral shape and size of the protruding elements defines 1:1 the lateral size and shape of small features to be exposed in the resist.

44 Claims, 6 Drawing Sheets

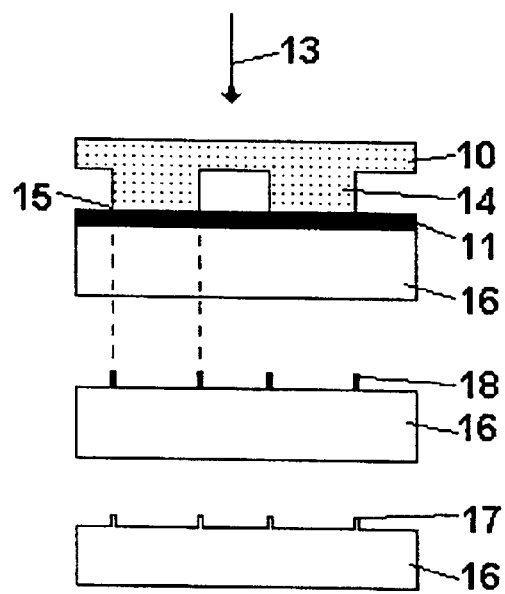
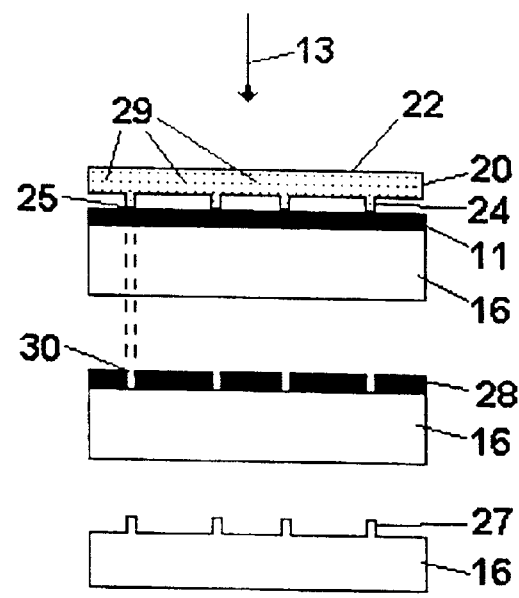
FIG. 1
PRIOR ART
FIG. 2

Master light coupling structure

Master light coupling structure 42  43  44 light coupling structure 42  43  44

■―――― 2 μm

OPTICAL LITHOGRAPHY BEYOND CONVENTIONAL RESOLUTION LIMITS

TECHNICAL FIELD

The present invention concerns a new scheme for optical lithography that allows extension of optical lithography beyond the conventional resolution limits imposed by the wavelength of the exposing light.

BACKGROUND OF THE INVENTION

The resolution of conventional optical lithography schemes is mainly limited by the wavelength of the light used for the transfer of a mask pattern onto a resist. The wavelength of the exposing radiation is a main determinant of pattern resolution W, given by the Rayleigh equation $W = k_j \lambda / NA$, where $\lambda$ is the wavelength of the exposing light, NA is the numerical aperture of the optical lithography tool, and $k_j$ is a constant for a specific lithography process. In other words, the resolution W is proportional to the wavelength $\lambda$ of the exposing light. Cutting edge production today creates features that are 250 nm wide using 248 nm illumination. Currently, the implementing schemes based on light are the bottleneck when trying to obtain structures of a feature size below 200 nm. State-of-the-art optical lithography system for making current DRAMs, for example, are quite expensive. Alternative processes become attractive when moving on to smaller feature sizes, but the required investments are huge. Thus techniques that maintain compatibility with much of the existing processes are inherently valuable.

Trends in both integrated circuit and flat-panel display manufacturing technologies require improvements in small scale lithography. In these and other fields, there is an increasing demand for a cost-effective lithographic technique that can produce large fields (to approximately 45 cm diagonal for displays) of nanoscale structures. The semiconductor industry road map calls for leading-edge manufacturing at 180 nm in the year 2001 and 70 nm in the year 2011.

One well known form of optical lithography is the so-called hard contact lithography, where the mask is moved directly into contact with the substrate targeted for patterning. Features on a mask, comprising alternatively translucent and opaque regions in a well-defined pattern, are printed into photo resist in a 1:1 relation to their area on the source. Hard contact lithography can, in principal, make structures with sizes below the wavelength of illumination. But the contact used to place the mask on the substrate compromises the integrity of the process as the possibility of confounding material on the surface of the mask and mask damage greatly limit (compared to projection lithography) the useful number of prints it can form. Cost is particularly worrisome as the feature scale shrinks and the expense of mask fabrication skyrockets with the increase in the density of its features. Contact masks are also generally much more expensive than those used in optical projection lithography since the critical dimensions in the former need to be smaller than those in the latter, for equivalent resolution, by the reduction factor used in a projection system. Dust particles and other physical impediments to the substrate are catastrophic in hard contact lithography as they lift the mask away from the surface, blurring the pattern. Such defects appear over an area much larger than the obscuring particle because the mask is unable to conform around their presence; this problem is compounded as the feature scale shrinks such that even a 200 nm particles can be harmful. In addition, resist can get stuck to the mask. Hard contact lithography has thus not found a significant role in manufacturing of small scale integrated circuits.

There are many approaches known, that improve conventional lithography systems in that filters, projection lens, or appropriately modified masks are employed. These approaches get more and more complicated and expensive with reducing feature scale. One example here is the so-called optical projection lithography. The optical lithography based on projection is undoubtedly the most successful and widely employed means of making features down to ~200 nm. Here, a pattern of intensity variations in the far field results when light is shown through a mask like that used in contact lithography. The light propagates through air and is focused by a lens to form an image of the desired pattern on a resist covered substrate, often demagnified by a factor of 5–10 from its size on the mask. Projection lithography is largely limited to features sizes at, and larger than, the wavelength $\lambda$ of light, however. Its implementation becomes increasingly difficult, in addition, as the scale shrinks towards, and below, 200 nm, where very complicated systems of lenses and materials are required to carry out existing and proposed schemes. The area over which uniform illumination can be achieved is particularly problematic. The maximum current field sizes in the best 248 nm exposure tools is now only ~20×20 mm. The useful area of exposure will continue to shrink dramatically with the wavelength of illumination, principally because of the materials and engineering challenges in forming uniform exposures through complex lenses based on silicates.

It is then generally a disadvantage of most of these approaches that they are getting more and more complicated and expensive when trying to obtain smaller feature sizes. Furthermore, there is a tradeoff between maximum resolution, depth of focus and achievable field image which comes from the use of a lens to focus the light.

The resolution of standard photolithography systems can be increased and feature size decreased by using masks that manipulate the phase (referred to as phase masks, phase shifting masks or PSMs) instead of the amplitude of the light used for exposure. Two examples of phase shift-based approaches are described by D.M. Tennant et al. in "Phase Grating Masks for Photonic Integrated Circuits Fabricated by E-Beam Writing and Dry Etching: Challenges to Commercial Applications", Microelectronic Engineering, Vol. 27, 1995, pp. 427–434, and by J. A. Rogers et al. in "Using an elastomeric phase mask for sub-100 nm photolithography in the optical near field", Appl. Phys. Lett., No. 70, Vol. 20, May 19, 1997, pp. 2658–2660.

Tennant et al. propose the use of hard contact masks, whereas Rogers et al. favor elastomeric masks 10 (see FIG. 1) for the formation of high density sub-wavelength features 17. In these methods the pattern on the mask results in interference in the illumination arising in the near field from contact between a photo resist 11 and the structured mask 10. Light passes everywhere through the mask 10 which is completely translucent but has a pattern of surface reliefs 14 that vary in a well-defined manner. Light traveling through such a structured mask 10 experiences a comparatively longer or shorter path depending on the place of its exit. This change in the effective path length through the structured mask 10 contributes to phase (and only phase) differences in the propagating light. These phase differences result in sub-wavelength nodes in intensity of the exposing radiation at the surface of the resist 11. If these masks 10 are designed and made appropriately, there are nodes at the mask/resist interface 15 with a relative minimum in intensity.

Rogers et al. showed that using a phase approach with an elastomeric mask allowed them to make sub-wavelength features 18 in a photo resist layer 11 while avoiding the problems associated with brittle contact masks (like Tennant et al.), as illustrated in FIG. 1. These features 18 can then be transferred into a substrate 16 by means of dry etching, or wet chemical dissolution of the substrate, as is well known in the art. The features 17 formed in the substrate have about the same lateral dimensions as the features 18 formed in the photo resist 11. The problem with the aforementioned approaches to lithography based on phase shifting of light through a mask 10 is that, while small features 17 (sub-wavelength) can be generated, these features 17 are constrained to a one dimensional geometry (lines) or low density on the substrate 16. Further, the shape of the structure 18 in resist is limited. In the paper of Rogers et al., the authors show that the phase shift in the light intensity provides structures 18 in resist 11 that are related to the derivative of the topology in the phase mask 10, i.e. each wall in the pattern of surface reliefs 14 in the phase mask 10 gives a relative minimum in the light intensity at the surface 15 of the resist 11. The width of this node is narrow but fixed so that only a very limited variation in the range of the lateral sizes of these features 18 and 17 is possible.

Making dots, squares or generally filled structures of arbitrary shape is not obviously possible in a single step by this technique. Moreover, in order for the phase shift to be present at all, the height of the surface reliefs 14 in the phase mask 10 must closely match the wavelength of the exposing light 13. This requirement of the phase shift approach means that the structures in a phase mask 10 are constrained to becoming increasingly anisotropic as their dimensions shrink, a significant problem in the formation of such features in elastomeric materials. It is another problem of these kind of approaches that there always are twin structures exposed in the resist, because each 'leg' 14 of the phase mask 10 generates a pair of nodes of low intensity at its edges.

The problem of mask fabrication described above remains, of course, as well as the susceptibility of the process to defects and damage. The use of an organic polymer to form the mask allows their convenient formation by a variety of techniques, perhaps most notably by replication of the mask from a master. Many polymeric masks can be cast on a single master with no evident wear of the latter since the process exerts no, or very little stress, on the substrate. Replication of masks avoids some of the problems associated with the costs of their use in contact lithographies for the formation of high density, small structures: the replica can be made so cheaply as to allow its use only once prior to its disposal. Not all structures are possible in many of the most convenient polymers, such as the elastomeric poly(dimethylsiloxane) used by Rogers et al., for these applications, however. The paper "Stability of Molded Polydimethylsiloxane Microstructures" by Delamarche et al. (Advanced Materials 1997, 9, p 741) showed that many features in ordinary elastomers collapse and tend toward increasingly poor definition and their anisotropy increases and their feature scale decreases, respectively.

There are proposals concerning other approaches and schemes by means of which the resolution of optical lithography systems can be somewhat extended to smaller feature sizes. An example is given in an article by H. Fukuda et al. with title "Can synthetic aperture techniques be applied to optical lithography?", published in J. Vac. Sci. Technol. B, Microelectron. Nanometer Struct. (USA), Vol. 14, No. 6, Nov. Dec. 1996, p. 4162–4166. This article discusses the theoretical feasibility of applying optical aperture synthesis to lithography. A technique involving the insertion of three phase gratings into a conventional projection system is described. While this approach paraxially yields imaging with doubled spatial bandwidth, aberrations introduced by the gratings are shown to be a serious limitation. Image simulations demonstrated that for very restricted pattern types, resolution down to 0.1 $\mu$m is theoretically achievable.

Using expensive optics and existing laser sources and photoresists, interferometric lithography can be extended to well beyond the horizons of the current industry road maps, as described by Ch. Xiaolan et al. in "Multiple exposure interferometric lithography—a novel approach to nanometer structures", Conference Proceedings—Lasers and Electro-Optics Society Annual Meeting 1996, p. 390–391.

More exotic schemes for sub-200 nm lithography are also being considered. X-ray, extreme UV and projected beams of electrons are all now the object of active research for manufacturing application. The problems with these techniques range from the difficulties of mask fabrication, the implementation of practical beam formation techniques, the need for novel resist materials that allow a functional and sensitive use of the beam intensity, practical problems in forming and stabilizing the beam and the ever present limitations of cost and complexity. It is an object of the present invention to provide a new optical photolithography scheme that allows extension of the use of optical lithography systems to feature sizes well below 350 nm, and in particular to feature sizes in the range between $\lambda/2$ and $\lambda/5$, using existing light sources.

SUMMARY OF THE INVENTION

The above objects have been accomplished by providing a parallel optical lithography system (referred to as light coupling structure) based on sets of light coupling portions and light blocking portions. The light coupling portions guide the exposing light towards a resist to be exposed and are designed to be brought into conformal contact with the resist such that the refractive index of the resist is selectively matched by the light coupling portions at predetermined locations on its surface. This selective matching of index by light coupling portions adjacent to index blocking structures allows light to be selectively and deterministically guided and coupled into defined regions of the resist. The lateral shape and size of the protruding elements defines 1:1 the lateral size and shape of small features to be exposed in a resist.

It is herein taught how to form and use light coupling structures that guide light to a surface that allow a new form of contact lithography for the parallel fabrication of sub wavelength features having arbitrary shape and high density on a substrate. We depend on the formation of these light couplers by direct contact of a substrate with a translucent mask (herein referred to as light coupling structure) that act to direct light onto the surface where the pattern forms. We use methods (described below) that avoid the use of reference waves and thus suppress interference effects common to the lithographies based on phase shifting light (phase shift mask approaches).

It is an important advantage of the inventive approach that no imaging optics are required. Large areas can be structured in single exposures since the present approach is inherently parallel as all features are exposed in the resist simultaneously providing a high throughput. The inventive scheme can be used for large field images and is thus well suited for the manufacturing of displays as well as the batch processing of semiconductor chips, such as DRAMs and so forth, and wherever else the formation of high density small structures is required. The present invention is also well suited for the formation of micro-mechanical structures.

The elastomeric light coupling structures can be easily replicated from a master copy, and each replica can be used many times.

It is an advantage of the present invention that compatibility with existing resist and processing technologies is maintained.

It is a further advantage of the present invention that one can make use of the huge amount of experience in the design and handling of resists, because these resists are continued to be used.

It is a further advantage, that multiple wavelengths can be used without adjustment of the light coupling structure, since lenses are not used.

It is another advantage of the present invention that the time of exposure is shorter than in case of conventional masks because lens and other means do not block, absorb or scatter the light unproductively.

It is further the advantage of the present invention that lithographic schemes implemented by its use are simple.

DESCRIPTION OF THE DRAWINGS

The invention is described in detail below with reference to the following schematic drawings:

FIG. 1 is a schematic illustration of the fabrication of nanometer-sized structures by the phase-shift method of J. A. Rogers et al. (prior art).

FIG. 2 is a schematic illustration of the fabrication of nanometer-sized structures by the inventive method.

DETAILED DESCRIPTION

In the present context the expression light coupling structure or light coupler are used to describe a mask-like object which can be placed between the light source which emits the exposing light and the structure (e.g. a substrate covered by a resist layer) to be patterned.

The inventive scheme makes use of the interaction at the boundaries (interfaces) of the light coupling structure. The refractive index of the light coupling structure ideally has to match that of the resist. For many of the existing materials the refractive index is between 1.4 and 1.5. In addition to the fact that the refractive index of the light coupling structure has to be appropriate, it has to be patterned such that the exposing light enters the light coupler and then propagates through the coupler, preferentially guided by internal reflections away from the interfaces that define the boundaries of the light coupler. That is the light coupling structure serves as wave guide. The light remains sufficiently confined to provide contrast in its intensity at the interface between the light coupling structure and the resist to be patterned. Conformity between the two ensures the highest possible level of coupling and thus contrast by insuring a close index match at their interface and thus suppressing unfavorable scattering of light.

Please note that we herein concentrate on reflections at the light coupler/air interface. When used in an environment other than air (inert gas, liquids, etc.), other materials with appropriate reflective index may have to be used to ensure that the light is properly guided by means of internal reflections.

Figure 3:
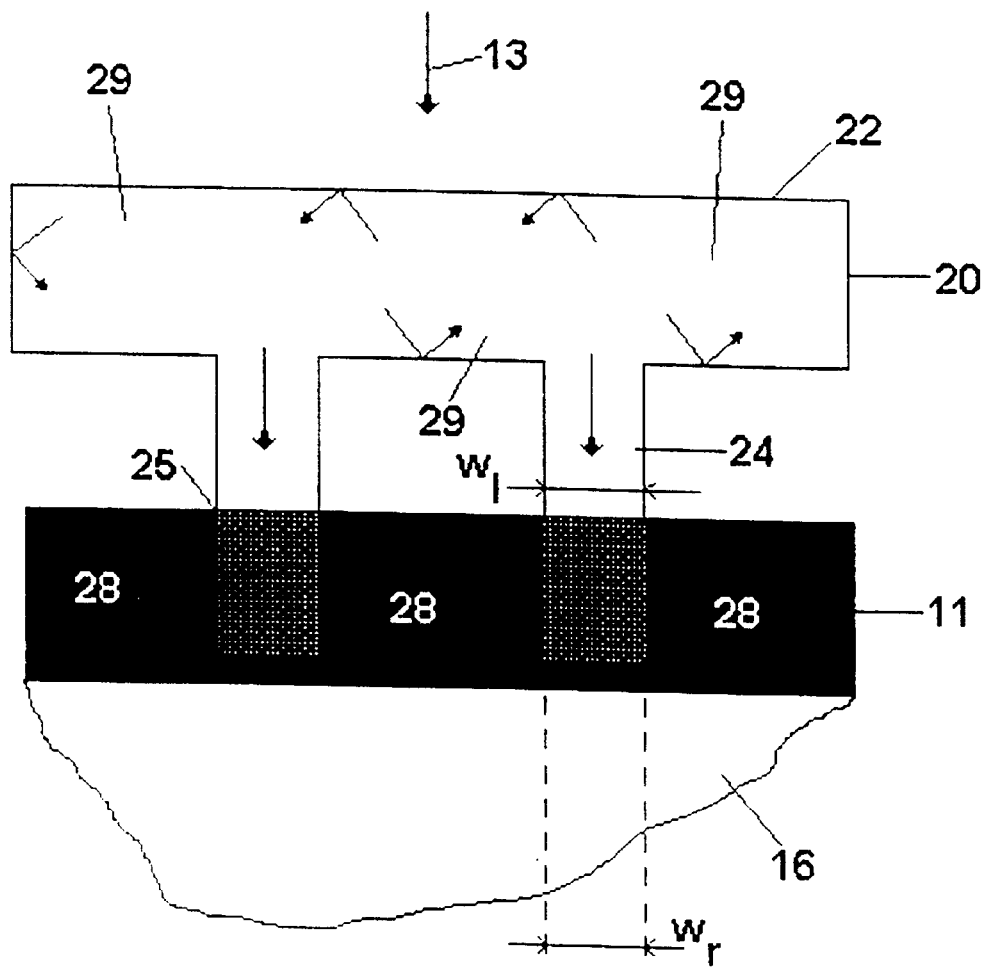
FIG. 3 is a schematic cross sectional view of the inventive light coupling structure situated on a resist.

A first embodiment of the present invention is now described in connection with FIGS. 2 and 3. In FIG. 2 a schematic illustration of the fabrication of nanometer-sized structures 27 by the inventive method is given. This Figure is shown right next to the conventional approach to highlight the fundamental differences of the two approaches. A schematic cross-sectional view of a light coupling structure 20, situated on a resist 11 is shown in FIG. 3. This light coupling structure 20 has an upper surface 22 through which exposing light 13 is coupled into it. Furthermore, the light coupling structure 20 has connecting portions 29 (also referred to as light blocking portions) which have interfaces to air, and light coupling portions 24 (also referred to as protruding portions, legs, or stamps) which are in direct contact with the resist 11. The exposing light 13 propagates through the light coupling structure 20 and is internally reflected at the air interfaces of the elevated portions 29, as indicated by arrows in FIG. 3.

Depending on the design of the light coupling structure, the connecting portions may block light 13, and guide it into the legs 24. These legs 24 form direct coupler/resist interfaces 25 where the exposing light 13 is coupled into the resist 11. The regions right underneath these interfaces 25 and inside the resist 11 are exposed by the exposing light 13, as indicated. If the resist 11 is a positive resist (i.e. a resist where the areas which were exposed to light become soluble), only the areas 28 which were not exposed to light remain stable when developing the resist, as shown in FIG. 2. After exposure and subsequent development process, small groves 30 show up.

Please note that the two expressions "protruding portion" and "connecting portion" is used to emphasize that the present light coupling structures are replicas formed from a master. There always will be certain portions which interconnect the protruding portions. These connecting portions mechanically connect the protruding portions, and serve as light blocking means. The connecting portions can consist of the same material as the protruding portions, when both are formed together as one replica from a master. The blocking function of the connecting portion may be improved by adding additional means, as will be addressed later. Also the light guiding and coupling properties of the protruding portions may be improved by appropriate measures, as will be shown.

The lateral shape and size of the legs 24 define the lateral shape and size of the exposed portions in the resist 11, because in an ideal light coupling structure light is coupled only through these legs into the resist. The width $w_l$ of the legs 24 of the light coupling structure 20, for example, directly defines the width $w_r$ of the exposed resist regions and the subsequently formed grooves 30.

It is important that the exposing light 13 coupled into the light coupler 20 is suited for the patterning of the resist 11. The exposing light can be polarized, monochromatic, polychromatic (broadband) or incoherent with wavelengths between at least 800 and 200 nm. Broadband light can be generated by a mercury lamp, for example. Argon ion lasers, YAG lasers, KrF lasers, and many other kind of light sources can be used. The light source may be a far field, unfocused source. The light emitted by the light source can be coupled into the light coupling structure through any of the interfaces such as the uppermost interface 22 in FIG. 3. Likewise, the light might be coupled into the light coupling structure by means of a wave guide or fiber from the top or side, or at the output of an LED or solid state laser. The wavelength of the light source may be optimized for a particular application. The light source may be pulsed, if deemed appropriate. Additionally, the light can be scanned over the light coupling structure or projected onto it in a pattern as when a projection system with an additional mask is used as the source The inventive scheme makes use of the interaction at the interfaces of the light coupling structure. The interface to air has to be designed such that the light is guided by means of internal reflection towards the light coupling portions (protruding elements) which are in conformal contact with the resist to be exposed. At the interface between the ends of the protruding elements and the resist, the light has to be coupled right into the resist, i.e. the protruding elements have to be designed such that this coupling between light coupling structure and resist is efficient. Practically, modulations in the light intensity of a factor of two and even less between areas on the resist in and out of contact with the end of the light coupling portions provide sufficient difference in existing resists to allow the generation of useful structures in the developed resist following its exposure.

The coupling efficiency depends on the refractive index of both the light coupling structure and the resist, on the wavelength (or wavelength range if polychromatic light is used), and so forth. There are different means how to optimize the coupling efficiency. The principal requirement is that there be no refractive index discontinuity at scales much less than the wavelength between the light coupling portion 24 and the resist 11. This situation is most readily accomplished by conformal contact between the two, that is an intimate matching between the two surfaces. Ideally, the index of both the light coupling structure and the resist are as high as possible since this causes a decrease in the effective wavelength of illumination used to carry out the lithography. Several possibilities exist to achieve this conformity. First, if the substrate and mask are both brittle, hard materials, then pressure can be applied to sandwich the two together, as in normal hard contact lithography. Second, the resist 11 can be made somewhat compliant by control over its composition and handling, allowing it to accommodate the surface of the posts 24 of the light coupling structure, insuring an intimate contact. Third, a thin layer of index matching material can be added to the posts like a viscous oil or polymer that serves to couple optically the posts 24 to the resist 11 in the case where both are brittle, hard materials. The index matching material is understood here to be complaint and must be localized to the posts to maintain the overall refractive index contrast between adjacent structures in the light coupling structure. Fourth, the blocking portions 20 and the light coupling portions 24 of the light coupling structure can be made from a material like an elastomer that provides the compliancy on contact between it and the resist. The portions 20 and 24 may be additionally deposited on a substrate (not shown in FIG. 2) that is at least partially translucent and much harder to facilitate handling and bulk positioning of the light coupling structure.

The resolution of the present approach is not strictly proportional to the wavelength of the light source, as in conventional photo lithography systems. Due to the fact that the inventive light coupling structure replaces the conventional mask, resolutions between $\lambda/2$ and $\lambda/5$ can be obtained. If an i-line light source (with $\lambda=365$ nm) is employed, features of size down to 73 nm ($=\lambda/5$) can be made. It is to be noted that the $\lambda/5$ limit is not a physical limit. From a theoretical point of view even smaller features can be made using the inventive approach depending on its implementation.

Conventionally available photo resists can be used in connection with the present invention. Generally suited are photo resists based on cresols (Novalacs), as are the resists on acrylates or styrenes and their mixtures, for example. Positive as well as negative tone resists can be employed. One may also use amplified resists to improve the ratio (width/depth) the features which are provided after exposure and development of the resist. Also used may be an optically guiding resist, such as the SU-8 negative tone resist that itself displays differential light guiding effects on exposure. Bilayer, trilayer and top-surface imaging resist schemes are all compatible and well suited for use with the present light coupling structures. Details about resists are given in text books and other publications such as the special issue of IBM's Journal of Research and Development with title "Optical Lithography", Vol. 41, No. 1/2, January/March 1997.

The exposure time depends on many well know parameters such as the light source wavelength, absorbance of the light coupling structure, sensitivity of the resist, coupling efficiency of the mask (or light coupling structure in the present context), thickness of the resist, contrast, and so forth.

In the following, a light coupling structure 20 and a method for making such a light coupling structure are described in detail. Well suited are polymers specially developed by the inventors. Several properties of the ideal polymer to form the replica can be identified. First the polymer must have a refractive index that is similar to that of the targeted resist. Second, the polymer must be capable of stable structure definition on its surface where the aspect ratio (their thickness to one of their areal dimensions) of the structures is at least 0.1. Third the material should be tough and somewhat compliant (as described above), allowing it to adapt to the surface of the resist on which it is placed, particularly where no other forces then gravity and interfacial energy are used to bring the two in contact. Fourth, the surface energy of the polymer is ideally low so that its contact with the resist is reversible and does not leave materials behind on the resist or tend to destroy it. Fifth, the material should be somewhat translucent to the targeted wavelength of illumination in order to allow the passage of light through, and out of, the light coupling structure. Sixth, the material should flow at some stage in its processing, either by melting it or by forming the polymer directly in the mold by chemical reaction. Seventh, the density changes and stresses associated with the previous requirement should be insufficient to cause breakage of the master or its incomplete replication. Eighth, the material should allow conformal contact, as described above. Siloxanes made by addition of low molecular weight silane containing crosslinkers to mixtures of branched and linear oleffin-terminated siloxane backbones have proved particularly advantageous in the above regards. Siloxane materials resulting from such mixtures can have surface energies of ~25 mN/m, strengths of ~10 Mpa and a viscosities of ~1000 cSt in their pre-polymer form and allow the formation of useful light coupling structures at, below, 100 nm feature scales, while maintaining the necessary conformity. Other materials based on all carbon elastomers are also well suited to the application, as are combinations of these materials with silica or siloxane containing fillers. Combinations of organic materials and inorganic materials into composite structures can prove particularly advantageous where a given material type is chosen to satisfy the required physical properties of a specific element of the light coupling structures, as discussed above.

In general, the material used for the formation of the light coupling structure has to be such that viable definition of features down to the size of the features—which are to be formed in a resist and the underlying semiconductor, since the present process is a true 1:1 process-possible. In other words, if a pillar or ridge 27 of 90 nm width is to be formed in a semiconductor substrate 16 (see FIG. 2), the width of the respective protruding element 24 of the light coupling structure 20 has to have a width of 90 nm, too (provided that a positive resist 11 is used).

A light coupling structure, according to the present invention, can be made by curing a polymer on a master 41 with the negative of the desired light coupling structure's surface. This results in an elastomeric solid 40 with a pattern of protruding elements 42, 43, 44. The master 41 can be formed using electron beam definition, for example. The time and money invested in the making of a precise, high resolution master 41 is amortized by making many replicas 40, each capable of being used in the manufacturing of semiconductor circuits, for example. Each of the replicas can be used several times and if made of elastomer does not tend to break.

The light coupling structure 40 has to be designed such that the protruding legs 42; 43, and 44 can be brought into conformal contact with the resist, because the whole process relies on the efficient coupling of light from the light coupling structure into the resist.

Figure 4A:
FIG. 4A is a schematic illustration of the fabrication of nanometer-sized light coupling structures, according to the present invention.
Figure 4A:
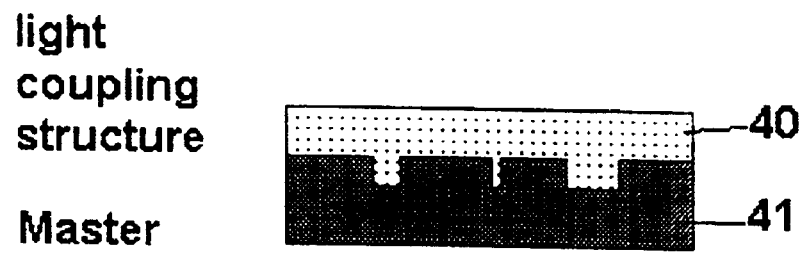
Figure 4A:
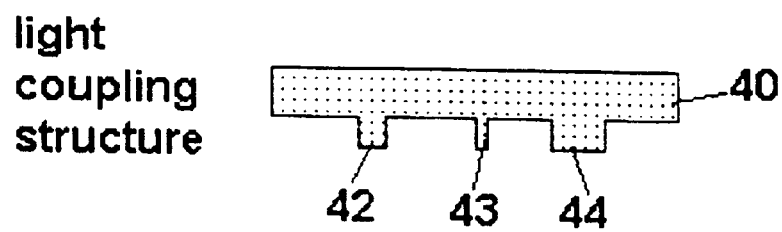
Figure 4B:
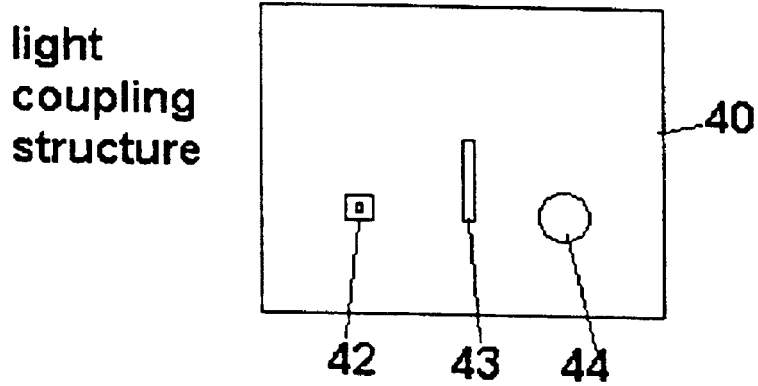
FIG. 4B is a schematic top view of a light coupling structure, according to the present invention.

The protruding elements of light coupling structures 40 can have almost any shape and size, as schematically indicated in FIG. 4B. In the present example, the light coupling structure 40 has three protruding legs 42, 43, and 44. The lateral cross section of the first leg 42 is a hollow rectangle or square. Leg 43 is a ridge, whereas leg 44 has a circular lateral cross section. These three examples show how flexible the present approach is.

DESCRIPTION OF A PREFERRED EMBODIMENT

A preferred embodiment is described in the following.

Master formation: A silicon wafer is covered with a 100 nm thick layer of plasma deposited silica in a homogeneous film. Polymethylmethacrylate polymer (980K), dissolved in clorobenzene to 15% solids, is spun on the wafer to form a 100 nm thick film of this resist on the substrate. The resist is selectively altered by its patterned exposure to a current of 100 KeV electrons using an e-beam mask-writer tool. Differential dissolution of the resist in acetone after exposure reveals a pattern of features in a periodic array with sizes down to 100 nm on the substrate. This pattern is transferred into the silica layer on the substrate using a fluorine based reactive ion etching (RIE) chemistry that has an excellent selectively towards silicon. The RIE process stops when the underlying silicon layer is reached thus insuring a uniform development of features in the silica layer with squared bottoms formed at the interface with silicon. Later this fact will help to insure the excellent definition of structures 24 in the light coupling part of the light coupling structure. The substrate is ashed in an oxygen plasma to remove residual organics and then 10 nm of a fluorinated polymer is deposited by a plasma assisted process all over the substrate to provide it with a low surface free energy coating (15 mN/m). This layer is essential to allow release of cured formed replica in the subsequent processing steps.

Light coupling structure preparation by its replication from a master: A mixture of ~6.5 g vinylmethyl siloxane-dimethyl siloxane copolymer (~1000 cSt, VDT 731 Gelest, Karlsruhe, Germany) and ~2 g methylhydrosiloxane-dimethylsiloxane copolymer (30 cSt, HMS 301, Gelest) and ~450 mg of fused silica particles (~20 nm in size, Gelest) is prepared with ~5 ppm of platinum catalyst. This mixture is poured directly onto the aforementioned master and cured in an oven at 60° for 24 h. The replica is released by peeling it by hand from the master. The replica has a surface energy of 23 mN/m, a strength of 10 Mpa and a hardness which is about 3% of that of glass. All of the features present on the master are faithfully reproduced in its replica according to the procedure above as determined by scanning electron microscopy (SEM), where a depression on the master is now a raised structure on the surface of the replica. A gold layer, 5 nm thick, is evaporated on top of the structures side of the replica. The replica so treated is then placed in contact with a silicon wafer having a layer of 1 nm of titanium followed by a layer of 30 nm of gold freshly evaporated on its surface; the gold on this surface is then treated by its exposure to the vapors of a 1,10 decanedithiol (Aldrich) for 5 minutes. After contact and release occurs between the surface of the replica and the treated gold surface of the silicon wafer, gold is selectively removed from the tops of the protruding surfaces of the replica, left behind on the treated gold surface of the silicon wafer by the adhesive contact between the two mediated by the presence of thiol terminated organic molecules at their interface.

Use of the light coupling structure: A 600 nm thick layer of Shipley 6612 (novalac) photo resist is spun coat on the surface of a silicon wafer previously treated with hexamethyldisilazide acting as an adhesion promoter for the resist. A 20 minute bake of the substrate is carried out at 90°. The light coupling structure described above is placed by hand on top of the photo resist covered substrate where gravity and interfacial forces between the two maintains their intimate conformal contact. Pulses from a KrF laser, (200, each 20 ns and 300 mnJ) are used to expose the resist, which is then developed in a Shipley 400K according to the instructions of the manufacturer.

FIGS. 6A–6D give representative views of the master, light coupling structure and structures that were formed over a field 1x1 cm (the size of the master) in the photo resist layer after the above described procedure was applied.

Because the light coupling structures are typically transparent, check-and-correct schemes of alignment become possible. The light coupling structures' position can be iteratively manipulated on the photo resist until a final positional placement is satisfied prior to the exposure. This type of alignment is not obviously possible with the currently used optical projection techniques that must rely instead on absolute knowledge of the substrate's location to achieve overlay accuracy.

It is another advantage of the inventive approach that the topology of the substrate need not be strictly planar. The light coupling structures allow some accommodation of surface roughness. The light coupling structures may be augmented as illustrated in FIGS. 5A–5E.

Figure 5A:
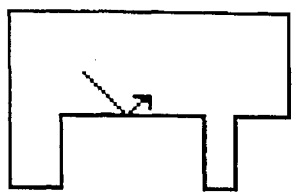
FIGS. 5A–E are schematic cross sectional views of different light coupling structures, according to the present invention.

The shown light coupling structures have all in common that there are special means provided such that the internal reflections at the light coupling structure/air interface are improved. In FIG. 5A, the simplest approach is shown. This approach was already demonstrated in FIGS. 2 and 3. The abrupt change in refractive index at the interface provides for a back-reflection of the incident light.

Figure 5B:
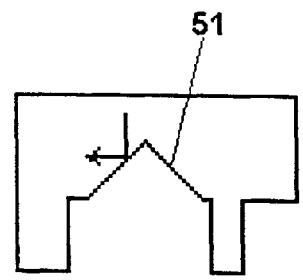
Figure 5C:
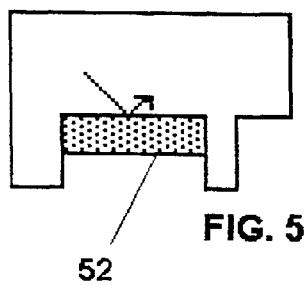
Figure 5D:
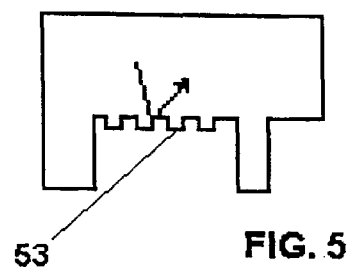

In FIG. 5B, a light coupling structure is shown where the elevated portion has sloped interfaces 51 to improve the internal reflections. Another approach is shown in FIG. 5C. Here, a reflecting layer 52, such as a metal (gold) layer is deposited on the elevated portions to increase the internal reflection, as shown in the example above. A grating 53, as shown in FIG. 5D, shows similar effects.

Figure 5E:
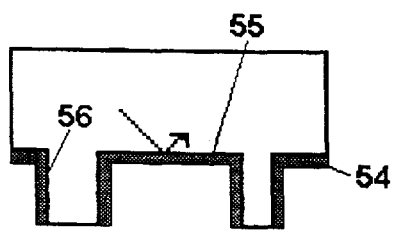

The light coupling structures described so far can be improved by applying a light blocking layer 54 to certain of the interfaces of the structure, as schematically illustrated in FIG. 5E. The light blocking layer 54 in the present example covers the interfaces 55 of the light blocking portions facing the resist, as well as the side walls 56 of the protruding light coupling portions.

Figure 5F:
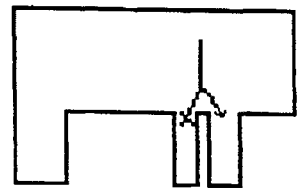
FIG. 5F is a schematic cross sectional view of another light coupling structure, according to the present invention.
Figure 6A:
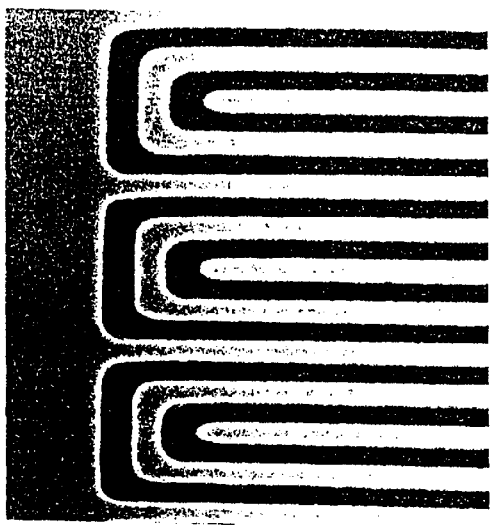
FIG. 6A is a representative top view of a master, according to the present invention.
Figure 6B:
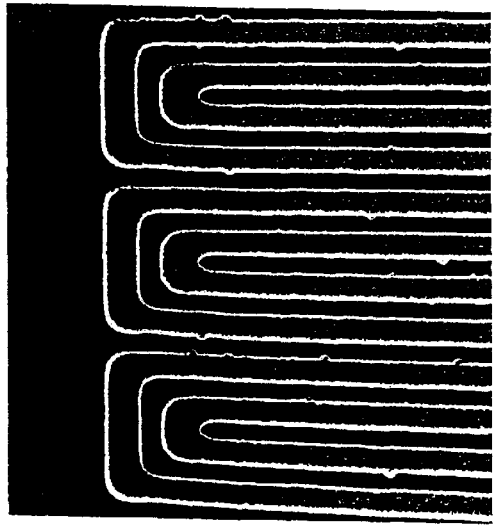
FIG. 6B is a representative top view of a light coupling structure (replica), according to the present invention.
Figure 6C:
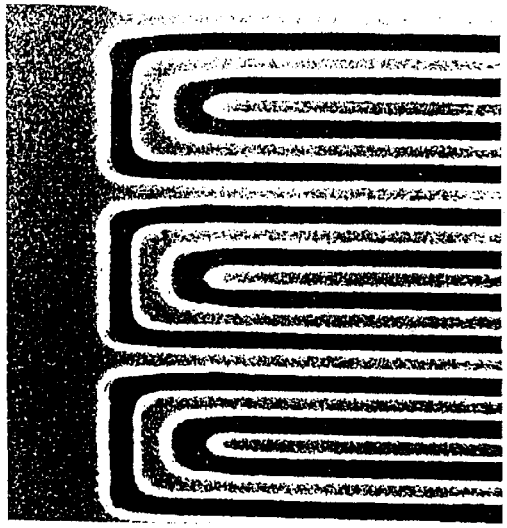
FIG. 6C is a representative top-view of an exposed resist, according to the present invention.
Figure 6D:
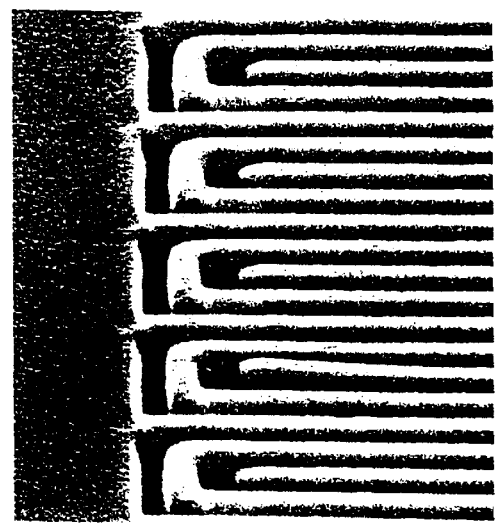
FIG. 6D is a representative 45°-view of the exposed resist, according to the present invention.
Figure 7:
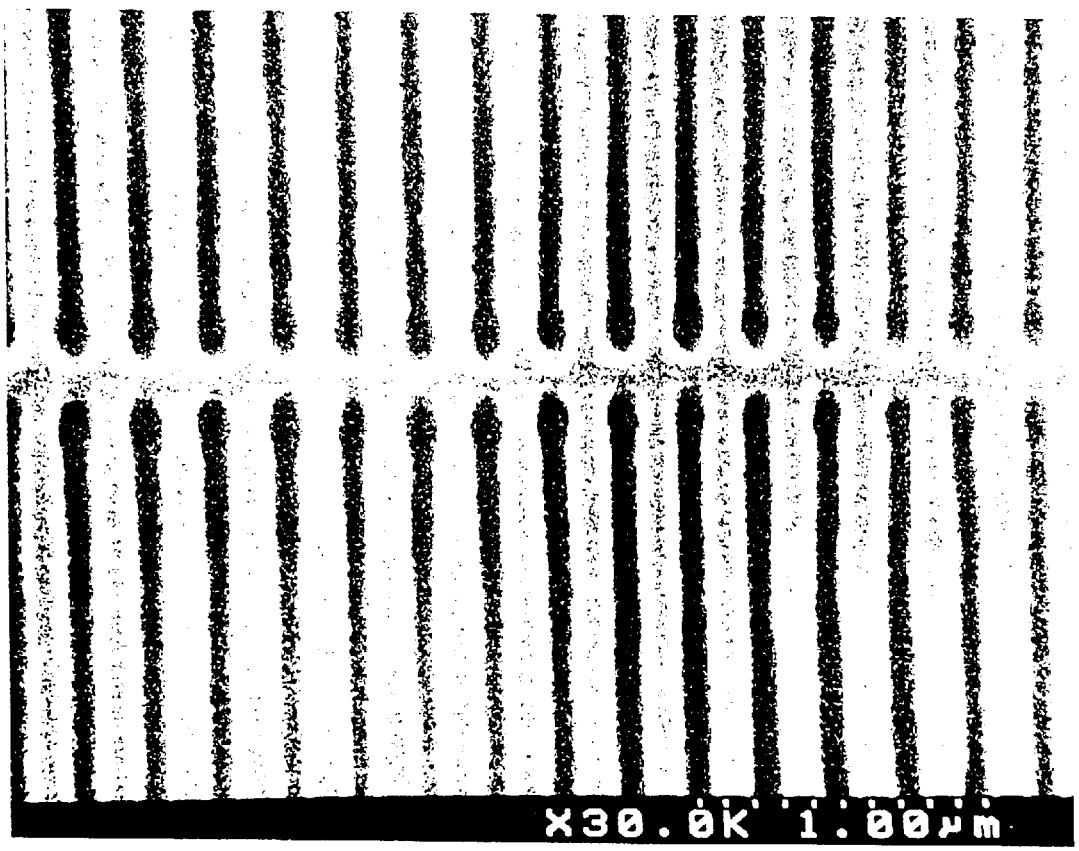
FIG. 7 is a representative top-view of an exposed resist, according to the present invention.

In FIG. 5F, a light coupling structure is shown where a thin slit or gap splits the light beam.

In the following we describe how a light coupling structure, according to the present invention can be used in a manufacturing process.

First, a resist is formed on a substrate to be patterned. Different methods are known in the art how such a resist can be formed. Then the light coupling structure, defined according to the present invention, is put onto the resist. If the light coupling structure is a flexible one, it may be rolled onto the resist. The structure's position with respect to the substrate is checked optically. A fine positioning apparatus is used to correct the position providing for a lateral relative movement between the light coupling structure and the substrate. Then the position is checked again, and the whole process is repeated till a sufficient alignment is achieved.

Now the light coupling structure may be pressed against the resist to improve the coupling efficiency. This step can be omitted depending on the circumstances. The light source is then turned on either in constant or pulsed mode. The light emitted by the light source and coupled into the light coupling structure is automatically guided towards the protruding ends, where it is directly coupled into the resist. The resist is exposed right underneath these protruding ends. At the end of the exposure process (if sufficient exposure has been achieved) the light is turned off, and the light coupling structure is removed Several wavelengths of light can be used to help suppress interference effects in the wave quitting structures when these structures have a variety of sizes, as can occur when these structures are much larger than the nominal wavelengths. Anti-reflection coatings and other such ideas can be added to the substrate or resist to suppress back reflections as is well known in the art.

Then, the resist is developed using a suited development step. In case of a positive tone resist the exposed portions of the resist are removed during the development step. If a negative tone resist is employed, only those portions which were not exposed to light are removed.

A hard backing step may be carried out before the next steps. The remaining portions of the resist now serve as mask protecting certain areas of the substrate from being etched away. A wet or dry etch step is now used to transfer the lateral shape and size of remaining portions of the resist into the substrate. Then, the resist is removed (ashed away).

We note that simply scaling down the known interference approaches based on phase shifting will not result in the type of lithography described and claimed herein. A reduction of the periodicy of the phase shifting mask proposed by Rogers et al. would lead to masks and processes which are not suited to providing the required intensity distribution with a relative minimum where a feature is to be defined in the resist, as becomes obvious from FIG. 4 of Rogers et al. If one would follow Roger's design rule, one would get exactly the opposite of what is disclosed and described herein. According to the present invention, the zero order mode (m=0) is used to carry out well-defined exposure of the resist. Rogers et al. rely on higher order modes of the light because otherwise they would not get interference effects and thus phase shifts.

It is also to be mentioned that prior to the inventors' work it was not possible to make masks suited for the use as light coupling structure, according to the present invention. As can be seen when comparing FIGS. 1 and 2, the protruding portions 24 of mask 20 have to have the lateral shape and size of the features 27 to be formed in the substrate 16. I.e. the protruding portions 24 have to be much smaller than the protruding portions 14 of mask 10.

What is claimed is:

1. A light coupling structure (20, 40) for use as mask for the exposure of a resist (11) with exposing light (13), comprising protruding portions (24, 42, 43, 44) guiding the exposing light (13) towards its end from where the exposing light (13) is coupled directly into the resist (11), the ends having the lateral shape of structures to be exposed in the resist (11), and connecting portions (29) which connect the protruding portions (24, 42, 43, 44) and block the exposing light (13) from exposing the resist (11) in areas other than those exposed through the protruding portions (24, 42, 43, 44), the light coupling structure (20, 40) having a refractive index relief, wherein the exposing light (13) is guidable by internal reflections towards the protruding portions (24, 42, 43, 44).

2. The light coupling structure of claim 1, wherein the exposing light (13) has a wavelength ($\lambda$) between 200 nm and 800 nm, and wherein the lateral shape of at least one of the protruding portions (24, 42, 43, 44) has a lateral dimension between one half ($\lambda/2$) and a fifth ($\lambda/5$) of the wavelength ($\lambda$) of the exposing light (13).

3. The light coupling structure of claim 1, wherein the lateral shape of at least one of the protruding portions (24, 42, 43, 44) has a lateral dimension between 200 nm and 73 nm.

4. The light coupling structure of claim 1 comprising an elastomer.

5. The light coupling structure of claim 4, wherein the elastomer is a polymer.

6. The light coupling structure of claim 5, wherein the polymer is s loxane made by addition of low molecular weight silane containing crosslinkers.

7. The light coupling structure of claim 4, wherein the elastomer is a carbon elastomer.

8. The light coupling structure of claim 1, wherein the protruding portions (24, 42, 43, 44) are index matched such that the exposing light (13) is efficiently couplable into the, resist (11).

9. The light coupling structure of claim 8 comprising the resist (11), wherein the index match is achievable by reducing the step in the refractive index between the protruding portion (24, 42, 43, 44) and the resist (11).

10. The light coupling structure of claim 8 comprising the resist (11), wherein the index match is achievable by providing a thin layer of index matching material between the protruding portion (24, 42, 43, 44) and the resist (11) which reduces the step in the refractive index between the protruding portion (24, 42, 43, 44) and the resist (11).

11. The light coupling structure of claim 8 comprising the resist (11), wherein the index match is achievable by providing a thin layer of a viscous oil or polymer between the protruding portion (24, 42, 43, 44) and the resist (11) which reduces the step in the refractive index between the protruding portion (24, 42, 43, 44) and the resist (11).

12. The light coupling structure of claim 1 comprising the resist (11), wherein the protruding portions (24, 42, 43, 44) are designed such that no refractive index discontinuity occurs.

13. The light coupling structure of claim 1 comprising the resist (11), wherein there is a conformal contact between the protruding portions (24, 42, 43, 44) and the resist (11).

14. The light coupling structure of claim 1 being usable with a negative or positive tone resist (11).

15. The light coupling structure of claim 1 comprising alignment marks for alignment with respect to the resist (11).

16. The light coupling structure of claim 1 comprising the resist (11), wherein the surface energy of the protruding portions (24, 42, 43, 44) is low so that its contact with the resist (11) is reversible and does not leave materials behind on the resist (11) and visa versa.

17. The light coupling structure of claim 1, wherein the connecting portions (29) comprise means to improve the blocking of the exposing light (13).

18. The light coupling structure of claim 17, wherein certain interfaces of the connecting portions (29) are covered by a layer increasing the reflection of the exposing light (13).

19. The light coupling structure of claim 17, wherein a thin metal layer is formed on certain interfaces of the connecting portions (29) to increase the reflection of the exposing light (13).

20. The light coupling structure of claim 17, wherein the connecting portions (29) comprise Bragg-gratings to increase the reflection of the exposing light (13).

21. The light coupling structure of claim 17, wherein the connecting portions (29) also serve as light guides which guide the exposing light (13) by means of internal reflections into the protruding portions (24, 42, 43, 44).

22. The light coupling structure of claim 1, wherein side walls of the protruding portions (24, 42, 43, 44) are covered by a layer increasing the internal reflections.

23. Method for making a light coupling structure (20, 40) for use as mask for the exposure of a resist (11) which comprises protruding portions (24, 42, 43, 44) with protruding ends the lateral shape of which is similar to the lateral shape of a structure to be exposed in the resist (11), and connecting portions (29) which connect the protruding portions (24, 42, 43, 44) and prevent exposing light (13) from exposing the resist (11) in areas other than those exposed through the protruding ends, the light coupling structure (20, 40) having a refractive index relief such that the exposing light (13) is guided by internal reflections towards the protruding ends of the light coupling portions, comprising the steps:

pouring a polymer on a master (41) with the negative relief of the protruding ends' lateral shape, curing the polymer on the master (41) to form a solid, elastomeric light coupling structure (20, 40) with a pattern of protruding portions (24, 42, 43, 44), removing the solid, elastomeric light coupling structure (20, 40) from the master (41).

24. The method of claim 23, wherein the polymer is siloxane made by addition of low molecular weight silane containing crosslinkers.

25. The method of claim 23, wherein the polymer is a carbon elastomer.

26. The method of claim 23, wherein a layer is formed on the light coupling structure (20, 40) after having been removed from the master (41), this layer is patterned so as to cover certain interfaces of the connection portions (29) to improve the reflection of the exposing light.

27. The method of claim 26, wherein the layer is a metal layer.

28. The method of claim 26, wherein the layer is selectively removed from the light coupling structures (20, 40) by its contact with another substrate that causes the material to adhere there.

29. The method of claim 26, wherein the other substrate is a soft polymer.

30. The method of claim 29, wherein the other substrate has a surface chemistry that promotes the adhesion of the layer by the formation of ionic or covalent bonds.

31. The method of claim 23, wherein the step of curing is carried out in an oven for several hours.

32. Method for the formation of sub-wavelength structures in a substrate (16), comprising the steps:

forming a resist (11) on the substrate (16), positioning a light coupling structure (20, 40) on the resist (11), which comprises protruding portions (24, 42, 43, 44) with protruding ends the lateral shape of which is similar to the lateral shape of the sub-wavelength structures to be formed, and connecting portions (29) which connect the protruding portions (24, 42, 43, 44) and prevent exposing light (13) from exposing the resist (11) in areas other than those exposed through the protruding ends, the light coupling structure (20, 40) having a refractive index relief such that the exposing light (13) is guided by internal reflections towards the protruding ends of the light coupling portions, the light coupling structure (20, 40) being positioned such that a conformal contact between the protruding portions (24, 42, 43, 44) and the resist (11) is ensured, aligning the light coupling structure (20, 40) with respect to the substrate (16), coupling exposing light (13) into the light coupling structure (20, 40) such that the exposing light (13) is guided into the protruding portions (24, 42, 43, 44) and from there coupled into the resist (11), removing the light coupling structure (20, 40), developing the resist to form a resist pattern, transferring the resist pattern into the substrate (16) by means of an etch process, removing the resist pattern.

33. The method of claim 32, wherein the resist (11) is negative or positive tone resist.

34. The method of claim 32, wherein the light coupling structure (20, 40) is held in place by means of gravity and interfacial forces only.

35. The method of claim 32, wherein the etch process is a dry etch process.

36. The method of claim 35, wherein the dry etch process is optimized to ensure a precise transfer of the resist pattern into the substrate (16).

37. Method for the manufacturing of a master (41) which is to be used for the formation of light coupling structures (20, 40) which comprise protruding portions (24, 42, 43, 44) with protruding ends the lateral shape of which is similar to the lateral shape of sub-wavelength structures to be formed, and connecting portions (29) which connect the protruding portions (24, 42, 43, 44) and prevent exposing light (13) from exposing a resist (11) in areas other than those exposed through the protruding ends, the light coupling structure (20, 40) having a refractive index relief such that the exposing light (13) is guided by internal reflections towards the protruding ends of the light coupling portions, the method comprising the steps:

covering a substrate (16) with a film, forming the resist (11) on the film, exposing the resist (11) using an e-beam mask-writer tool thus defining a negative relief of the protruding portions (24, 42, 43, 44) of the light coupling structure (20, 40) to be formed, developing the resist (11) to reveal the negative relief, transferring the negative relief into the film by means of an etch process which stops on the underlying substrate (16), removing the resist (11) revealing the negative relief of the protruding portions (24, 42, 43, 44).

38. The method of claim 37, wherein a low surface free energy coating is applied to the negative relief of the protruding portions (24, 42, 43, 44).

39. The method of claim 37, wherein the substrate (16) is a silicon substrate.

40. The method of claim 37, wherein the film is a silica film.

41. The method of claim 37, wherein a polymer is used as resist (11).

42. The method of claim 37, wherein electrons of about 100 KeV are used for e-beam lithography.

43. The method of claim 37, wherein the etch process is a reactive ion etch process.

44. The method of claim 37, wherein the master (41) ashed in an oxygen plasma to remove residual organics.

* * * * *